US 8,482,966 B2
Jul. 9, 2013

(12) United States Patent
Kang et al.

(10) Patent No.: US 8,482,966 B2
(45) Date of Patent: Jul. 9, 2013

(54) MAGNETIC ELEMENT UTILIZING PROTECTIVE SIDEWALL PASSIVATION (75) Inventors: Seung H. Kang, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 659 days.

(21) Appl. No.: 12/236,943

(22) Filed: Sep. 24, 2008

(65) Prior Publication Data
US 2010/0072566 A1  Mar. 25, 2010

(51) Int. Cl.
*G11C 11/15* (2006.01)
*G11C 11/155* (2006.01)
*H01L 29/82* (2006.01)
*H01L 21/00* (2006.01)

(52) U.S. Cl.
USPC ............ 365/158; 257/421; 257/E43.004; 438/3

(58) Field of Classification Search
USPC ............ 365/158; 257/421, E43.004; 438/3
See application file for complete search history.

(56) References Cited

U.S. PATENT DOCUMENTS

| | | | |
|---|---|---|---|
| 6,680,832 B2 * | 1/2004 | Fontana et al. | 360/324.2 |
| 6,714,444 B2 | 3/2004 | Huai et al. | |
| 6,784,091 B1 * | 8/2004 | Nuetzel et al. | 438/618 |
| 6,829,161 B2 | 12/2004 | Huai et al. | |
| 6,838,740 B2 | 1/2005 | Huai et al. | |
| 6,847,547 B2 | 1/2005 | Albert et al. | |
| 6,888,742 B1 | 5/2005 | Nguyen et al. | |
| 6,929,957 B2 * | 8/2005 | Min et al. | 438/3 |
| 6,958,927 B1 | 10/2005 | Nguyen et al. | |
| 6,977,401 B2 * | 12/2005 | Hosotani | 257/295 |
| 6,992,359 B2 | 1/2006 | Nguyen et al. | |
| 7,009,266 B2 * | 3/2006 | Shi et al. | 257/421 |
| 7,009,877 B1 | 3/2006 | Huai et al. | |
| 7,057,862 B2 * | 6/2006 | Kasiraj et al. | 360/324.12 |
| 7,057,921 B2 | 6/2006 | Valet | |
| 7,088,609 B2 | 8/2006 | Valet | |
| 7,106,624 B2 | 9/2006 | Huai et al. | |
| 7,110,287 B2 | 9/2006 | Huai et al. | |
| 7,126,202 B2 | 10/2006 | Huai et al. | |
| 7,161,829 B2 | 1/2007 | Huai et al. | |
| 7,190,611 B2 | 3/2007 | Nguyen et al. | |
| 7,227,773 B1 | 6/2007 | Nguyen et al. | |
| 7,230,845 B1 | 6/2007 | Wang et al. | |
| 7,233,039 B2 | 6/2007 | Huai et al. | |

(Continued)

FOREIGN PATENT DOCUMENTS

JP  2007273493 A  10/2007

OTHER PUBLICATIONS

International Search Report—PCT/US2009/057523, International Search Authority—European Patent Office Jan. 4, 2010.

(Continued)

*Primary Examiner* — Evan Pert
(74) *Attorney, Agent, or Firm* — Michelle Gallardo (57) ABSTRACT

Exemplary embodiments of the invention are directed to magnetic elements including a passivation layer for isolation from other on-chip elements. One embodiment is directed to an apparatus comprising a magnetic tunnel junction (MTJ) element. The MTJ element comprises: a first ferromagnetic layer; a second ferromagnetic layer; an insulating layer disposed between the first and second ferromagnetic layers; and an MTJ passivation layer forming protective sidewalls disposed adjacent to the first ferromagnetic layer, the second ferromagnetic layer, and the insulating layer.

23 Claims, 9 Drawing Sheets

U.S. PATENT DOCUMENTS

| | | |
|---|---|---|
| 7,241,631 B2 | 7/2007 | Huai et al. |
| 7,242,045 B2 | 7/2007 | Nguyen et al. |
| 7,242,048 B2 | 7/2007 | Huai |
| 7,245,462 B2 | 7/2007 | Huai et al. |
| 7,282,755 B2 | 10/2007 | Pakala et al. |
| 7,286,395 B2 | 10/2007 | Chen et al. |
| 7,289,356 B2 | 10/2007 | Diao et al. |
| 7,369,427 B2 | 5/2008 | Diao et al. |
| 7,382,643 B2 | 6/2008 | Ashida et al. |
| 7,430,135 B2 | 9/2008 | Huai et al. |
| 7,432,574 B2 | 10/2008 | Nakamura et al. |
| 7,436,699 B2 | 10/2008 | Tanizaki et al. |
| 7,443,718 B2 | 10/2008 | Ito et al. |
| 7,446,979 B2* | 11/2008 | Jayasekara .................... 360/319 |
| 7,449,345 B2* | 11/2008 | Horng et al. ...................... 438/3 |
| 7,459,739 B2 | 12/2008 | Hurst et al. |
| 7,463,509 B2 | 12/2008 | Kim et al. |
| 7,476,954 B2* | 1/2009 | Wang et al. .................... 257/421 |
| 7,486,475 B2* | 2/2009 | Biskeborn .................... 360/121 |
| 7,528,457 B2* | 5/2009 | Horng et al. .................. 257/421 |
| 2002/0191354 A1 | 12/2002 | Yoshikawa |
| 2004/0137681 A1 | 7/2004 | Motoyoshi |
| 2005/0048674 A1* | 3/2005 | Shi et al. ........................... 438/3 |
| 2005/0276099 A1* | 12/2005 | Horng et al. ................... 365/158 |
| 2006/0002184 A1* | 1/2006 | Hong et al. .................... 365/171 |
| 2006/0138576 A1* | 6/2006 | Galdis ............................ 257/421 |
| 2007/0155027 A1* | 7/2007 | Ditizio ............................... 438/3 |
| 2007/0241410 A1 | 10/2007 | Umehara |
| 2007/0243638 A1* | 10/2007 | Horng et al. ...................... 438/3 |
| 2007/0246787 A1 | 10/2007 | Wang et al. |
| 2008/0023740 A1* | 1/2008 | Horng et al. ................... 257/295 |
| 2008/0171223 A1* | 7/2008 | Wang et al. .................... 428/675 |
| 2008/0316657 A1* | 12/2008 | Zhang et al. ............. 360/324.11 |
| 2009/0027810 A1* | 1/2009 | Horng et al. ............... 360/324.2 |
| 2009/0173977 A1* | 7/2009 | Xiao et al. ..................... 257/295 |
| 2009/0194833 A1* | 8/2009 | Wang et al. ................... 257/421 |
| 2009/0256220 A1* | 10/2009 | Horng et al. .................. 257/421 |
| 2009/0261433 A1* | 10/2009 | Kang et al. .................... 257/421 |

OTHER PUBLICATIONS

Written Opinion—PCT/US2009/057523, International Search Authority—European Patent Office Jan. 4, 2010.

Hosomi et al., "A Novel Nonvolatile Memory with Spin Transfer Torque Magnetization Switching: Spin-RAM", Electron Devices Meeting, 2005, IEDM Technical Digest, IEEE International Dec. 5, 2005, Piscataway, NJ, USA, IEEE, Dec. 5, 2005, pp. 459-462, XP010903510, ISBN: 978-0-7803-9268-7.

Debrosse et al., "A High-Speed 128-kb MRAM Core for Future Universal Memory Applications", IEEE Journal of Solid-State Circuits, Vol. 39, No. 4, April 2004, pp. 678-683.

Tang et al., "An IC Process Compatible Nonvolatile Magnetic RAM", Electron Devices Meeting, 1995, International, Dec. 10-13, 1995, pp. 997-999.

Jeong et al., "A 0.24-μm 2.0-V 1T1MTJ 16-kb Nonvolatile Magnetoresistance RAM With Self-Reference Sensing", IEEE Journal Of Solid-State Circuits, vol. 38, No. 11, Nov. 2003, pp. 1906-1910.

Taiwan Search Report—TW098132346—TIPO—Oct. 26, 2012.

* cited by examiner

PARALLEL MAGNETIZATION
LOW RESISTANCE
STATE "0"

PRIOR ART
FIG. 1A

ANTIPARALLEL MAGNETIZATION
HIGH RESISTANCE
STATE "1"

PRIOR ART
FIG. 1B

READ & WRITE

MAGNETIC ELEMENT UTILIZING PROTECTIVE SIDEWALL PASSIVATION

FIELD OF DISCLOSURE

Embodiments of the invention are related to magnetic element devices. More particularly, embodiments of the invention are to related magnetic elements including a passivation layer for isolation from other on-chip elements.

BACKGROUND

Magnetoelectronic devices, also referred to as spin electronics devices or spintronics devices, are used in numerous information technologies, and provide for non-volatile, reliable, radiation resistant, and high-density data storage and retrieval. Examples of magnetoelectronic devices include, but are not limited to, magnetic random access memory (MRAM), magnetic sensors, and read/write heads for disk drives.

Typically, a magnetoelectronic device, such as a magnetic memory element, has a structure that includes multiple ferromagnetic layers separated by at least one non-magnetic layer. Information is stored in a magnetic memory element as the direction of magnetization vectors in the magnetic layers. Magnetization vectors in one magnetic layer, for instance, are magnetically fixed or pinned, while the magnetization direction of the other magnetic layer is free to switch between the same and opposite directions that are called "parallel" and "antiparallel" states, respectively. In response to parallel and antiparallel states, the magnetic memory element represents two different resistances. The resistance has a minimum value when the magnetization vectors of the two magnetic layers point in substantially the same direction, and a maximum value when the magnetization vectors of the two magnetic layers point in substantially opposite directions. Accordingly, a detection of change in resistance allows a device, such as an MRAM device, to detect the information stored in the magnetic memory element.

Figure 1A:
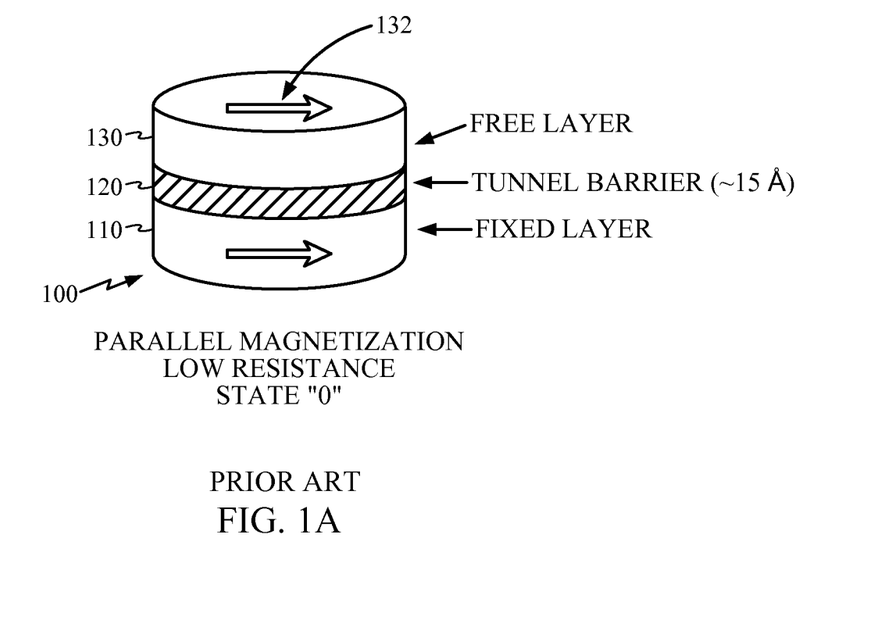
FIGS. 1A and 1B illustrate a type of magnetic memory element known as a magnetic tunnel junction element in parallel and anti-parallel states, respectively.
Figure 1B:
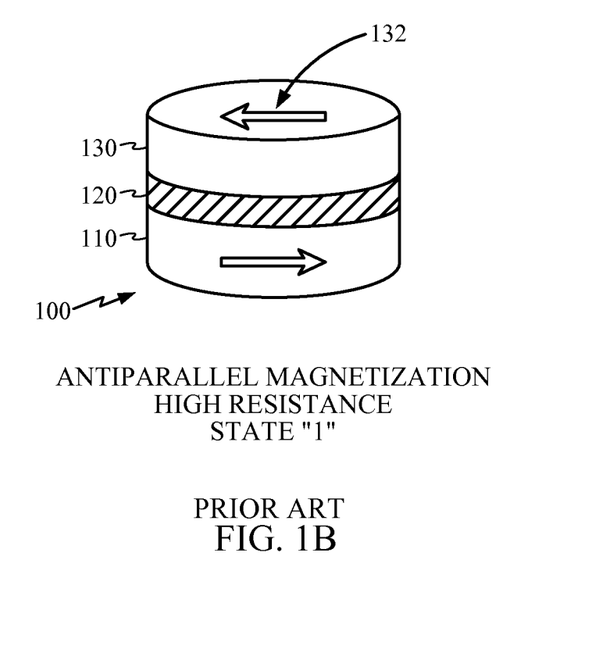

FIGS. 1A and 1B illustrate a type of magnetic memory element known as a magnetic tunnel junction element in parallel and anti-parallel states, respectively.

As shown, a magnetic tunnel junction (MTJ) element 100 can be formed from two magnetic layers 110 and 130, each of which can hold a magnetic field, separated by an insulating (tunnel barrier) layer 120. One of the two layers (e.g., fixed layer 110), is set to a particular polarity. The other layer's (e.g., free layer 130) polarity 132 is free to change to match that of an external field that can be applied. A change in the polarity 132 of the free layer 130 will change the resistance of the MTJ element 100. For example, when the polarities are aligned (FIG. 1A), a low resistance state exists. When the polarities are not aligned (FIG. 1B), a high resistance state exists. The illustration of MTJ 100 has been simplified and those skilled in the art will appreciate that each layer illustrated may comprise one or more layers of materials, as is known in the art.

In contrast to conventional RAM technologies which store data as electric charges or current flows, MRAM uses magnetic elements such as MTJ 100 to store information magnetically. MRAM has several desirable characteristics that make it a candidate for a universal memory, such as high speed, high density (i.e., small bitcell size), low power consumption, and no degradation over time. However, MRAM has scalability issues. Specifically, as the bit cells become smaller, the magnetic fields used for switching the memory state increase. Accordingly, current density and power consumption increase to provide the higher magnetic fields, thus limiting the scalability of the MRAM.

Figure 2A:
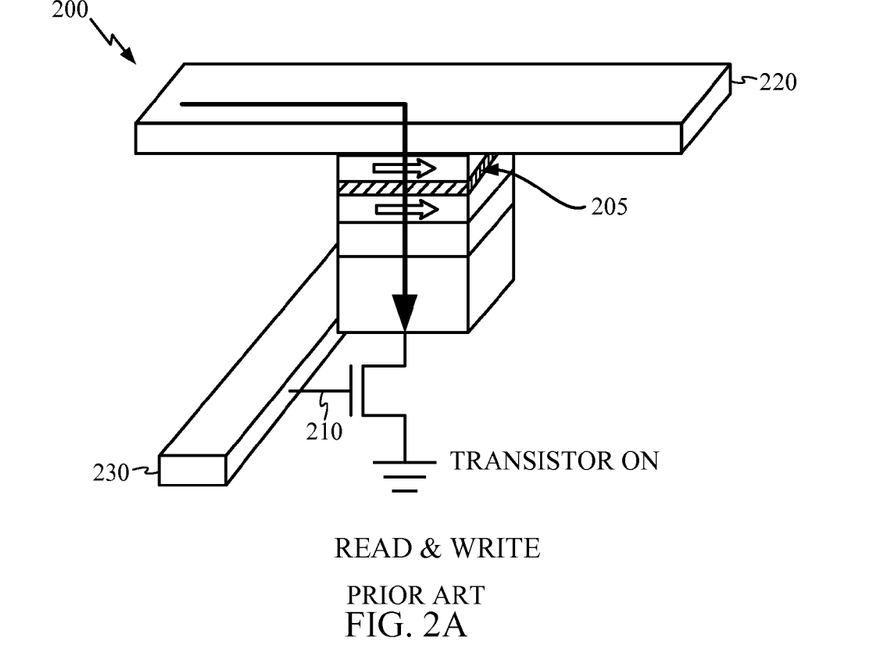
FIGS. 2A and 2B illustrate Spin Transfer Torque Magnetoresistive Random Access Memory (STT-MRAM) cells.

Unlike conventional MRAM, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM). During the write operation, the spin-polarized electrons exert a torque on the free layer, which can switch the polarity of the free layer. The read operation is similar to conventional MRAM in that a current is used to detect the resistance/logic state of the MTJ storage element, as discussed in the foregoing. As illustrated in FIG. 2A, a STT-MRAM bit cell 200 includes MTJ 205, transistor 210, bit line 220 and word line 230. The transistor 210 is switched on for both read and write operations to allow current to flow through the MTJ 205, so that the logic state can be read or written.

Figure 2B:
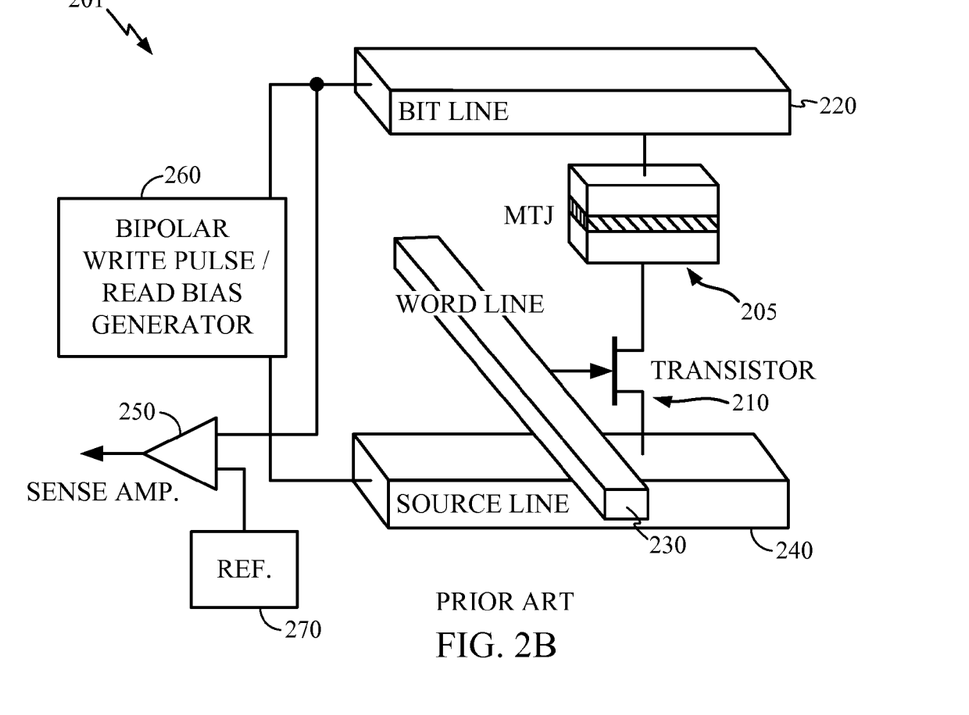

Referring to FIG. 2B, a more detailed diagram of a STT-MRAM cell 201 is illustrated, for further discussion of the read/write operations. In addition to the previously discussed elements such as MTJ 205, transistor 210, bit line 220 and word line 230, a source line 240, sense amplifier 250, read/write circuitry 260 and bit line reference 270 are illustrated. As discussed above, the write operation in an STT-MRAM is electrical. Read/write circuitry 260 generates a write voltage between the bit line 220 and the source line 240. Depending on the polarity of the voltage between bit line 220 and source line 240, the polarity of the free layer of the MTJ 205 can be changed and correspondingly the logic state can be written to the cell 201. Likewise, during a read operation, a read current is generated, which flows between the bit line 220 and source line 240 through MTJ 205. When the current is permitted to flow via transistor 210, the resistance (logic state) of the MTJ 205 can be determined based on the voltage differential between the bit line 220 and source line 240, which is compared to a reference 270 and then amplified by sense amplifier 250. Those skilled in the art will appreciate the operation and construction of the memory cell 201 is known in the art.

Additional details are provided, for example, in M. Hosomi, et al., A Novel Nonvolatile Memory with Spin Transfer Torque Magnetoresistive Magnetization Switching: Spin-RAM, proceedings of IEDM conference (2005), which is incorporated herein by reference in its entirety.

A key challenge in embedding STT-MRAM into sub-100 nm CMOS logic devices is to integrate the MTJ stack (e.g., layers 110, 120, and 130 collectively) with common Back-End-Of-The-Line (BEOL) interconnects, such as contacts, insulators, metal levels, bonding sites for chip-to-package connections, etc., without substantially impacting yield and reliability. The problem is that the MTJ may be damaged during BEOL processing, or that mobile ions and other contaminants related to the MTJ can degrade BEOL inter-level dielectrics (ILDs). Integration is particularly challenging when the MTJ is disposed with fine-pitch interconnects (e.g., to achieve smaller memory cells) in conjunction with the ILDs common to sub-100 nm CMOS devices.

The MTJ needs to not only form and comply with specified characteristics throughout the manufacturing steps, but also function reliably. In addition, the incorporation of various materials used for the MTJ need to not adversely affect the BEOL interconnects.

That is, there should be relatively few or no mobile ions or contaminants allowed into BEOL ILDs.

SUMMARY

Exemplary embodiments of the invention are directed to magnetic elements including a passivation layer for isolation from other on-chip elements.

One embodiment is directed to an apparatus comprising a magnetic tunnel junction (MTJ) element. The MTJ element comprises: a first ferromagnetic layer; a second ferromagnetic layer; an insulating layer disposed between the first and second ferromagnetic layers; and an MTJ passivation layer forming protective sidewalls disposed adjacent to the first ferromagnetic layer, the second ferromagnetic layer, and the insulating layer.

Another embodiment is directed to a method of forming a magnetic tunnel junction (MTJ) device including an MTJ element. The method comprises: forming a first ferromagnetic layer; forming a second ferromagnetic layer; forming an insulating layer disposed between the first and second ferromagnetic layers; and forming an MTJ passivation layer of protective sidewalls disposed adjacent to the first ferromagnetic layer, the second ferromagnetic layer, and the insulating layer.

Another embodiment is directed to an apparatus comprising a magnetic tunnel junction (MTJ) element. The MTJ element comprises: a first ferromagnetic layer; a second ferromagnetic layer; an insulating layer disposed between the first and second ferromagnetic layers; and MTJ passivation means disposed adjacent to the first ferromagnetic layer, the second ferromagnetic layer, and the insulating layer for at least partially isolating the MTJ element electrically and magnetically from interference.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of embodiments of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of embodiments of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

As discussed in the background, integration of magnetic tunnel junction (MTJ) elements with Back-End-Of-The-Line (BEOL) interconnects has conventionally degraded the MTJ elements during BEOL processing, as well as allowed mobile ions and MTJ contaminates to adversely impact the interconnects themselves. Accordingly, embodiments of the invention provide an MTJ stack with sidewalls that are encapsulated by a thin, protective passivation layer. This layer, which is an insulating film both electrically and magnetically, can be fabricated using a common CMOS scheme following MTJ etching. The layer may be formed sufficiently thin so as to not impact the cell layout, but still adequately thick to function as a protective layer, not only throughout manufacturing, but also during device operation in the field.

Figure 3:
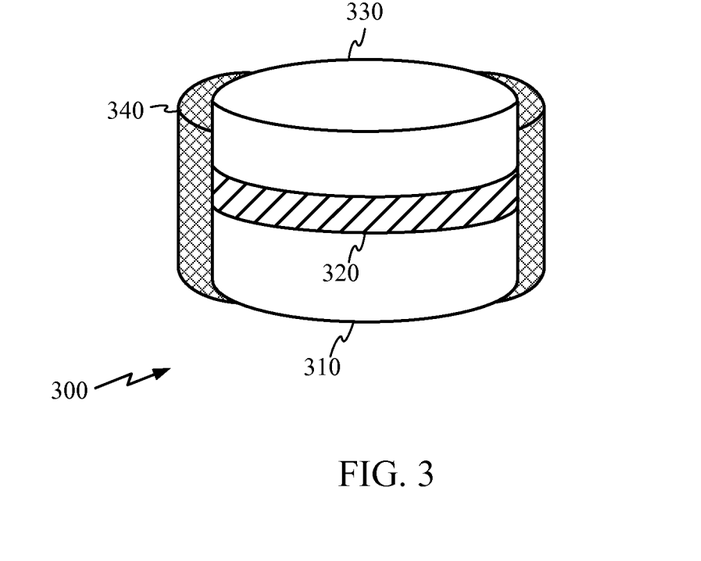
FIG. 3 illustrates an MTJ element including a passivation layer.

FIG. 3 illustrates an MTJ element including a passivation layer according to an embodiment of the invention.

As shown, MTJ 300 is formed from two magnetic layers 310 and 330, each of which are capable of holding a magnetic field, separated by an insulating (tunnel barrier) layer 320. MTJ 300 further includes an MTJ passivation layer 340. MTJ passivation layer 340 forms sidewalls adjacent to the other MTJ layers 310, 320, and 330 (collectively referred to as the MTJ stack). Although the term 'adjacent' is used herein to describe the orientation of the MTJ passivation layer 340 relative to the MTJ stack, one skilled in the art will appreciate that the MTJ passivation layer 340 need not be in direct physical contact with the MTJ stack as other layers (not shown) may in fact intervene physically. The important aspect of their relative orientation is simply that MTJ passivation layer 340 be interposed between the MTJ stack and any interconnects, forming a barrier against mobile ions and other contaminants both during BEOL processing and subsequent device operation. Accordingly, the term 'adjacent' as used herein is meant to convey only relative orientation of MTJ passivation layer 340 to the MTJ stack, and is not intended to connote direct physical contact.

MTJ passivation layer 340 is a film used to insulate the MTJ stack both electrically and magnetically from the various interconnects. For example, MTJ passivation layer 340 can be formed as dielectric sidewalls adjacent to the MTJ stack of layers 310, 320, and 330. MTJ passivation layer 340 can be fabricated using a common CMOS scheme following MTJ etching. MTJ passivation layer 340 may be formed of one or multiple well-known materials used in CMOS manufacturing. For example, MTJ passivation layer 340 may be a dielectric layer, and may be formed of silicon dioxide, silicon carbide, silicon nitride, or the like.

MTJ passivation layer 340 may be formed sufficiently thin so as to not impact the cell layout, but still adequately thick to function as a protective layer. For example, the thickness may be in the range of about 5 nm to about 100 nm. The thickness with which MTJ passivation layer 340 is formed is application specific and depends on the feature size of the CMOS technology used.

Figure 4:
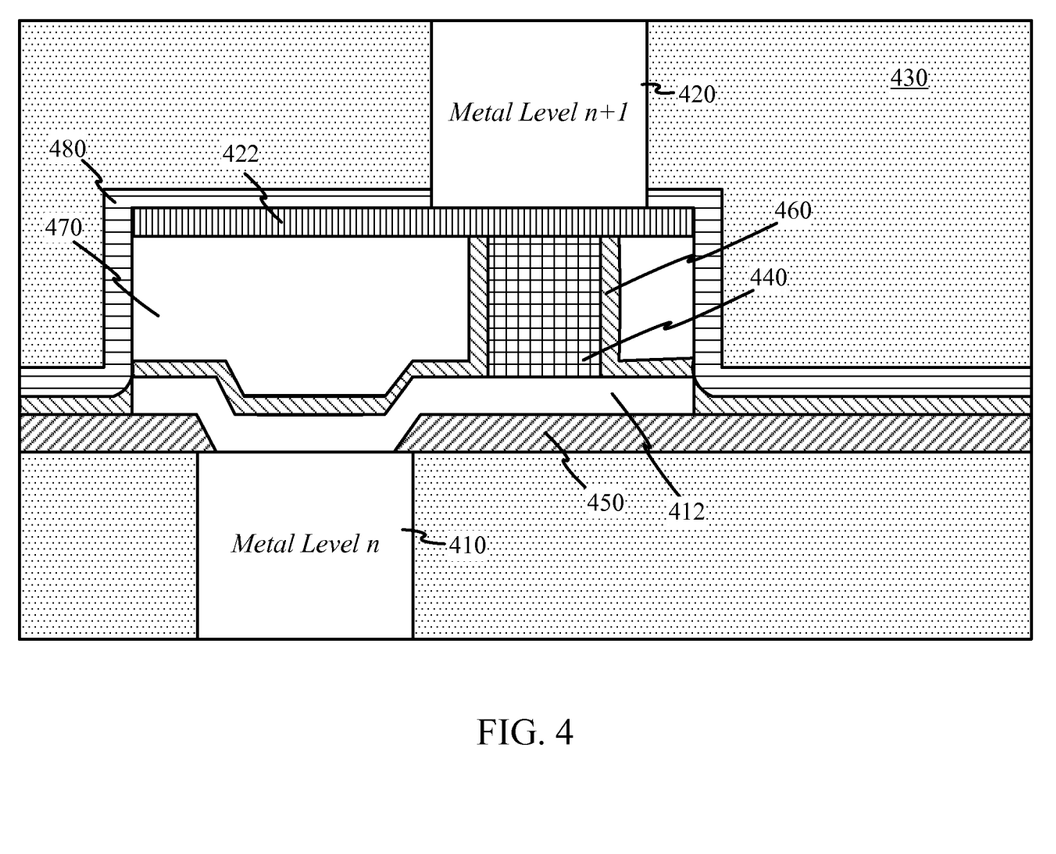
FIG. 4 illustrates a cross-sectional, layer view of a portion of an MTJ device including a passivation layer.

FIG. 4 illustrates a cross-sectional, layer view of a portion of an MTJ device including a passivation layer according to an embodiment of the invention.

As shown, the device includes an MTJ element 440. MTJ 440 may be formed as a stack of layers in accordance with any of the descriptions above, such as MTJ 100, 300, etc. Two metal levels 410 and 420, disposed in an inter-level dielectric (ILD) 430, form the electrical connections on either side of the MTJ 440. A bottom electrode 412 and a top electrode 422 form the electrical contacts between the MTJ 440 and the two metal levels 410 and 420, respectively. For inter-layer isolation, a global passivation layer 480 may be formed between the two metal levels 410 and 420. It will be appreciated that global passivation layer 480 is an optional feature that can provide additional inter-layer isolation according to one or more embodiments, but may be omitted according to other embodiments as desired. The global passivation layer 480 may be made of a carbide, nitride, or oxide compound, or the like. In addition, a dielectric layer 450 (e.g., SiC) may be used as an insulating barrier between the metal layer 410 and an inter-level via (not shown) that locally connects the two metal levels 410 and 420.

MTJ passivation layer 460 is formed adjacent to MTJ 440 to provide isolation from ILD 430, as described in more detail above. Although not illustrated explicitly in the cross-sectional view of FIG. 4, it will be appreciated that MTJ passivation layer 460 may be formed in a continuous film sidewall surrounding MTJ 440 to protect all sides of MTJ 440. Because MTJ 440 may not necessarily occupy the entire intervening space between the top and bottom electrodes 412 and 420, the intervening space can be filled with an insulating film 470, such as a carbide, nitride, or oxide compound, or the like.

According to further embodiments, an auxiliary shielding film made of a relatively high permeability material (e.g., permalloy) can be formed adjacent to the passivation sidewalls to provide additional magnetic shielding and further isolation of MTJ elements. The auxiliary shielding film can be used to reduce thermo-mechanical stress on the MTJ, but introduces an additional material if not already a part of the MTJ stack.

Figure 5:
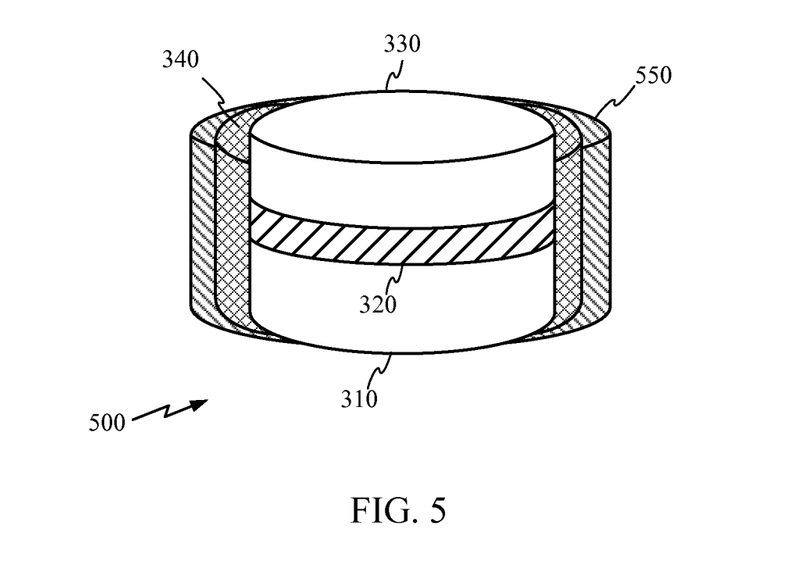
FIG. 5 illustrates an MTJ element including a passivation layer and an auxiliary shielding film.

FIG. 5 illustrates an MTJ element including a passivation layer and an auxiliary shielding film according to an embodiment of the invention.

As shown, MTJ element 500 includes an MTJ stack of layers 310 through 330 and a passivation layer 340, formed in accordance with the design of FIG. 3. In addition, an auxiliary shielding film 550 is formed adjacent to passivation layer 340. As discussed above, auxiliary shielding film 550 provides additional magnetic shielding of MTJ 500 above that provided by passivation layer 340 alone.

Similar to MTJ passivation layer 340, auxiliary shielding film 550 may be formed sufficiently thin so as to not impact the cell layout, but still adequately thick to function as a shielding layer. The thickness with which auxiliary shielding film 550 is formed is application specific and depends on the feature size of the CMOS technology used. In general, a thicker auxiliary shielding film 550 provides better shielding, but the thickness may be limited by the size of the top and bottom electrodes.

Figure 6:
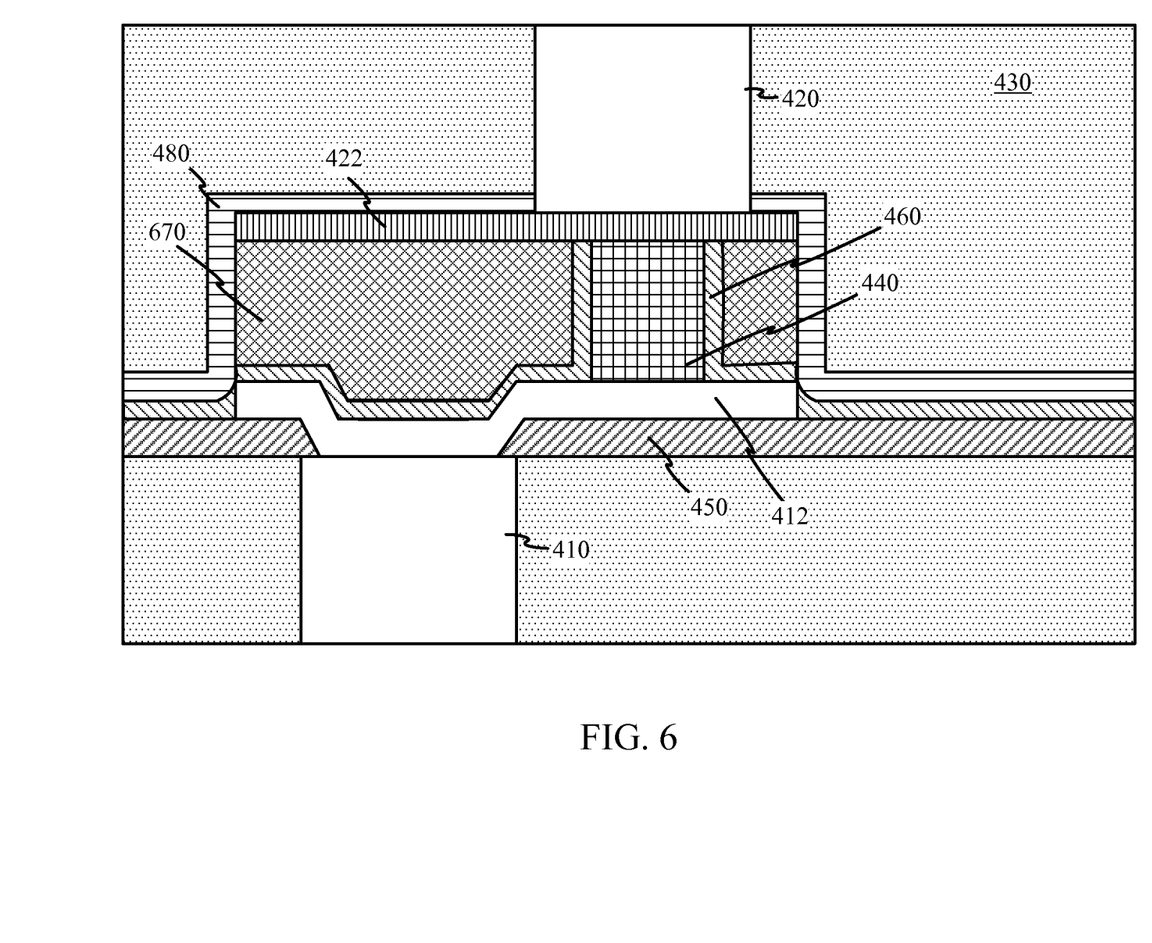
FIG. 6 illustrates a cross-sectional, layer view of a portion of an MTJ device including a passivation layer and an auxiliary shielding film.

FIG. 6 illustrates a cross-sectional, layer view of a portion of an MTJ device including a passivation layer and an auxiliary shielding film according to an embodiment of the invention.

As shown, the device of FIG. 6 includes an MTJ element 440, two metal levels 410 and 420, a bottom electrode 412, a top electrode 422, a dielectric layer 450, an MTJ passivation layer 460, and a global passivation layer 480, disposed in an ILD 430, formed in accordance with the design of FIG. 4. However, in place of the insulating film 470, the design of FIG. 6 includes an auxiliary shielding film 670 formed in the intervening space between the top and bottom electrodes 412 and 420.

The use of a relatively high permeability, auxiliary shielding film may be desirable as devices scale to smaller pitches between MTJ elements, leading to increased mutual interference. However, the use of auxiliary shielding films requires more materials, and potentially a greater number manufacturing processes. Thus, the designs of FIGS. 3 and 4 as compared to those of FIGS. 5 and 6 represent a trade-off between performance and cost, allowing the designer to meet a varying range of application specific requirements using various embodiments of the invention.

Furthermore, in some embodiments, a hybrid approach is used in which a partial auxiliary shielding film of a desired thickness is formed adjacent to the MTJ passivation layer, and the remaining space between the top and bottom electrodes is filled with an insulating film. This hybrid approach allows the designer to fine tune the trade-offs of the designs of FIGS. 3 through 6 by forming the auxiliary shielding film over a range of desired thicknesses.

Figure 7:
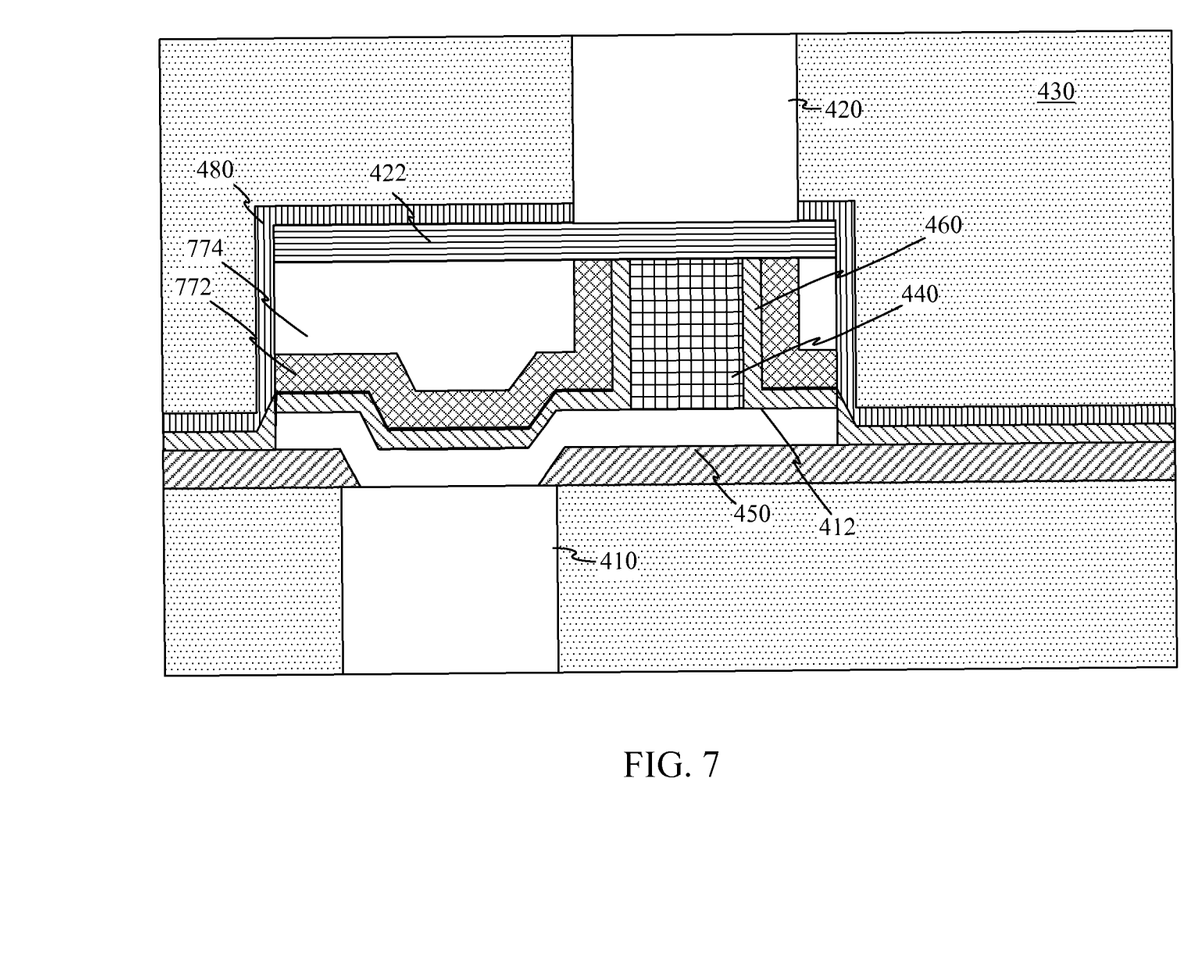
FIG. 7 illustrates a cross-sectional, layer view of a portion of an MTJ device including a passivation layer and a partial auxiliary shielding film.

FIG. 7 illustrates a cross-sectional, layer view of a portion of an MTJ device including a passivation layer and a partial auxiliary shielding film according to an embodiment of the invention.

As shown, the device of FIG. 7 includes an MTJ element 440, two metal levels 410 and 420, a bottom electrode 412, a top electrode 422, a dielectric layer 450, an MTJ passivation layer 460, and a global passivation layer 480, disposed in an ILD 430, formed in accordance with the designs of FIG. 4 and/or FIG. 6. However, in place of the full auxiliary shielding layer 670 of FIG. 6 and the full insulation layer 470 of FIG. 4, the design of FIG. 7 includes a partial auxiliary shielding layer 772 formed on MTJ passivation layer 460 and a partial insulation layer 774 formed on the partial auxiliary shielding layer 772.

Regarding the contact electrodes described above, the designs of FIGS. 4, 6, and 7 include a top electrode 422 and bottom electrode 412 formed of equal length. However, according to some embodiments, the top electrode 422 can be patterned using the MTJ 440 mask itself, without the need for an additional processing step. This simplifies formation of the device and reduces processing complexity.

Figure 8:
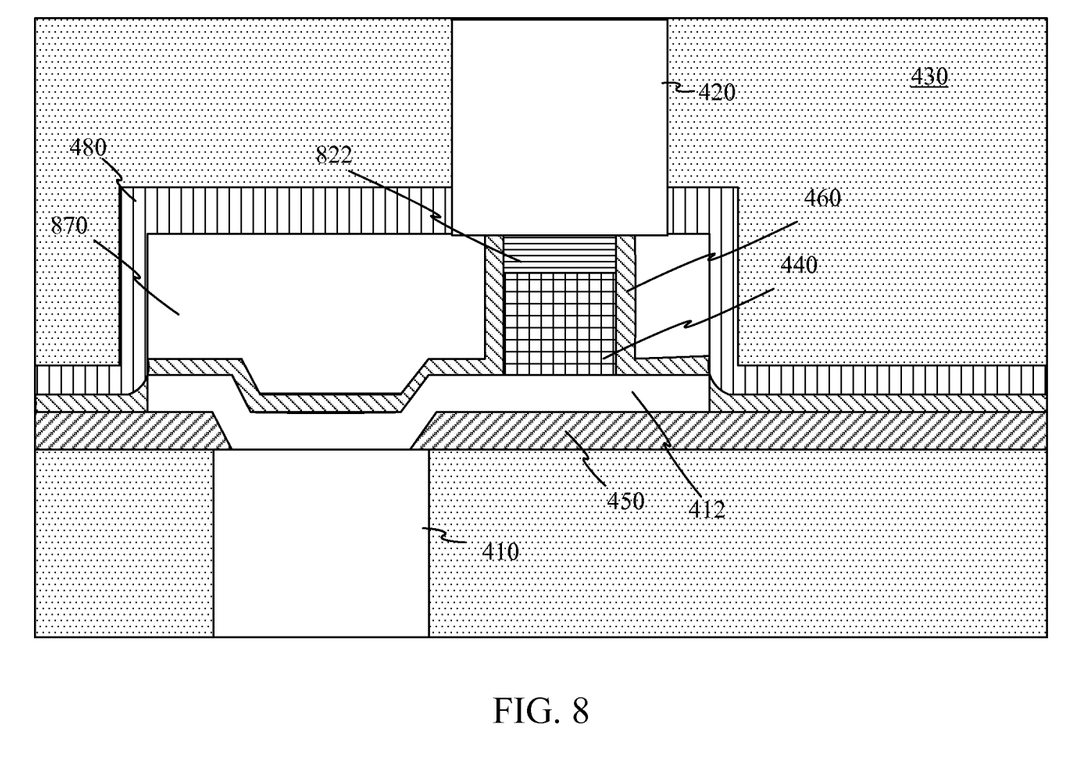
FIG. 8 illustrates a cross-sectional, layer view of a portion of an MTJ device including a top electrode patterned by an MTJ mask.

FIG. 8 illustrates a cross-sectional, layer view of a portion of an MTJ device including a top electrode patterned by an MTJ mask according to an embodiment of the invention.

As shown, the device of FIG. 8 includes an MTJ element 440, two metal levels 410 and 420, a bottom electrode 412, a dielectric layer 450, an MTJ passivation layer 460, and a global passivation layer 480, disposed in an ILD 430, formed in accordance with the designs of FIGS. 4, 6 and/or 7. FIG. 8 further illustrates an intervening region 870, which can be implemented according to any of the designs of the preceding FIGS. 4, 6, or 7. In contrast to the preceding designs, however, FIG. 8 illustrates a top electrode 822 patterned by the mask used for MTJ element 440. Top electrode 822 therefore spans only the width of MTJ element 440. In addition, MTJ passivation layer 460 is also formed on the sides of top electrode 822.

Figure 9:
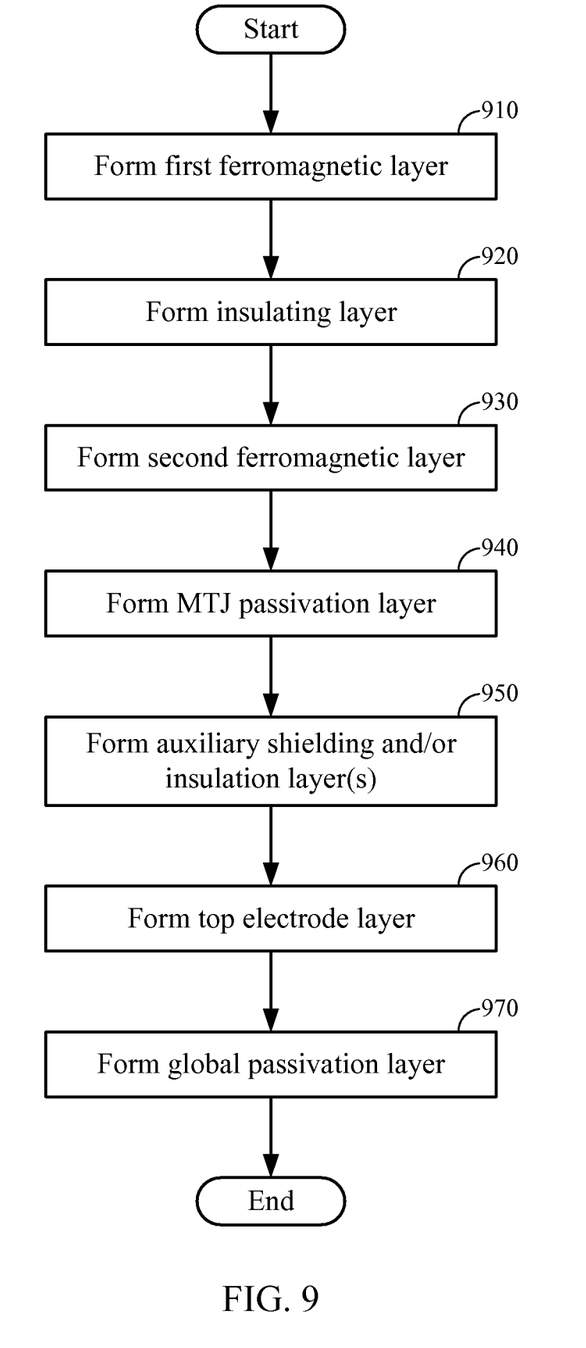
FIG. 9 illustrates a method of fabricating an MTJ device.

FIG. 9 illustrates a method of fabricating an MTJ device according to an embodiment of the invention.

With reference to FIGS. 3 through 8, a first ferromagnetic layer 310/330 is formed on a substrate or another layer, e.g., bottom electrode 412 (block 910). An MTJ insulating layer 320 is formed on the first ferromagnetic layer 310/330 (block 920). A second ferromagnetic layer 330/310 is formed on the MTJ insulating layer 320 (block 930). The first ferromagnetic layer 310/330, MTJ insulating layer 320, and second ferromagnetic layer 330/310 (collectively, MTJ stack 310/320/330) form MTJ element 440. An MTJ passivation layer 340/460 is formed adjacent to the MTJ stack 310/320/330 (block 940). An auxiliary shielding layer 670/772 and/or an insulation layer 470/774 are formed adjacent to the MTJ passivation layer 340/460 (block 950). A top electrode 422/822 is formed on the MTJ stack 310/320/330, MTJ passivation layer 340/460, auxiliary shielding layer 670/772, and/or insulation layer 470/774 (block 960). A global passivation 480, when desired, can be formed between the metal layer 410 and an inter-level via (not shown) that locally connects the two metal levels 410 and 420 (block 970). Again, each layer may be composed on of one or multiple layers made of one or more materials, and a layer said to be formed on another layer need not necessarily be formed in direct contact with that layer. The formation of each layer may be done according to well-known CMOS processing techniques.

It will be appreciated that the flow diagram of FIG. 9 is intended to illustrate the various layer formations according to various embodiments, but is not intended to convey a particular sequence of formation steps as different embodiments may require different layers to be formed in different sequences. For example, when the top electrode 822 is patterned by the mask used for MTJ element 440, as in FIG. 8, the process sequence is such that top electrode 822 is formed before MTJ passivation layer 460. However, when the top electrode 422 is formed independently of the mask used for MTJ element 440, as in FIGS. 4, 6, and 7, the process sequence is such that top electrode 422 is formed after MTJ passivation layer 460.

Figure 10:
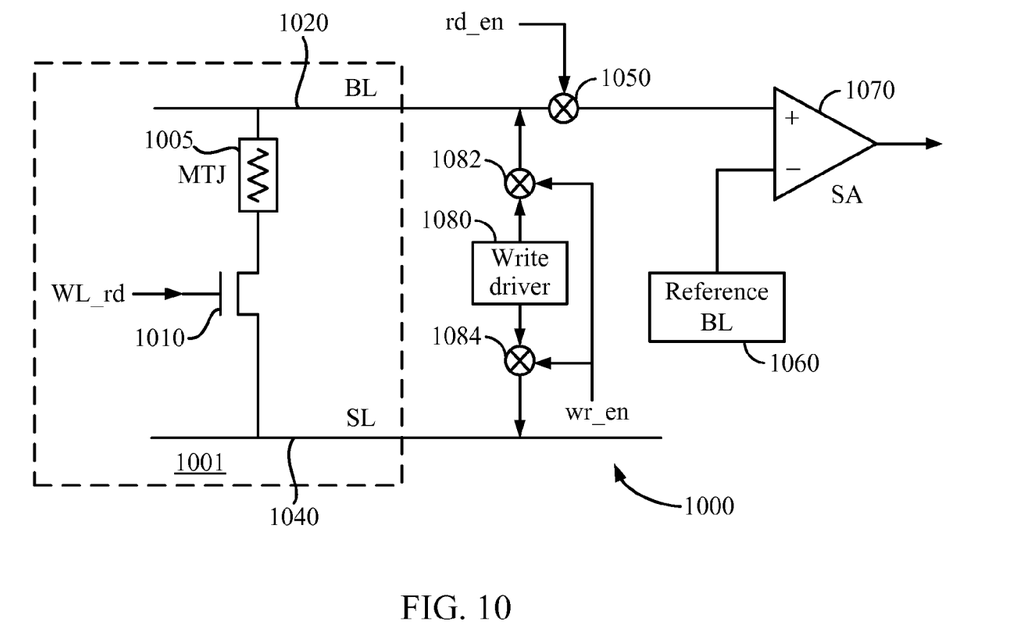
FIG. 10 illustrates an STT-MRAM circuit including an MTJ element.

FIG. 10 illustrates an STT-MRAM circuit including an MTJ element according to an embodiment of the invention.

The circuit includes a bit cell 1001 including a MTJ 1005 and word line transistor 1010 coupled between bit line (BL) 1020 and source line (SL) 1040. Word line transistor 1010 receives a word line read voltage (WL_rd) from the word line (not shown). A read isolation element 1050 is coupled to the bit line 1020 to isolate sense amplifier 1070 during a write operation. Element 1050 (e.g., read mux) can be used to select one of the bit lines during read operation as well as provide sense amplifier isolation. As will be appreciated by those skilled in the art, read isolation element 1050 can be any device or combination of devices that can couple the sense amplifier 1070 to the bit line 1020 during read operations and can isolate sense amplifier 1070 during the write operations. For example, the isolation element 1050 can be a transmission gate coupled in series with an input of sense amplifier 1070. However, those skilled in the art will appreciate that other devices and/or combinations of devices such as multiplexers and the like may be used. Further, those skilled in the art will appreciate that the circuit configuration illustrated herein is merely to facilitate the description of aspects of embodiments of the invention and is not intended to limit the embodiments to the illustrated elements and/or arrangements.

Referring back to FIG. 10, the isolation element 1050 can receive a read enable signal (rd_en) to coordinate with the read operation. A sense amplifier 1070 is coupled to the bit line 1020 and to a reference 1060. Sense amplifier 1070 can be used to determine the state of the bit cell 1001 by amplifying the voltage differential between the bit line 1020 and the reference 1060 at the input of the sense amplifier 1070 during the read operation. During the read operation, transistor 1010 is conducting and a read current flows through the MTJ 1005. The read isolation element 1050 will be conducting and a voltage in proportion to the resistance of the MTJ 1005 will be generated and detected at sense amplifier 1070. As discussed above, the resistance will vary based on the logic state of the MTJ 1005. Accordingly, the data stored in bit cell 1001 can be read. A write driver 1080 and write isolation elements 1082 and 1084 are coupled between the bit line 1020 and source line 1040 to enable selection of a bit line and writing data to bit cell 1001.

MTJ 1005 can be implemented using the techniques described herein to protect against degradation during BEOL processing and insulate the rest of circuit 1000 from mobile ions and other MTJ contaminates. For example, MTJ 1005 may be implemented as shown in any one of FIGS. 3 through 8 and/or fabricated as illustrated in FIG. 9.

While the foregoing disclosure shows illustrative embodiments of the invention, it should be noted that various changes and modifications could be made herein without departing from the scope of embodiments of the invention as defined by the appended claims. For example, while the techniques described herein for fabricating magnetic elements have been generally directed towards MTJ elements and STT-MRAM devices, one skilled in the art will appreciate that the passivation layer may be used in conjunction with various magnetoelectic elements in various applications to provide isolation from other on-chip elements. Also, specific logic signals corresponding to the transistors/circuits to be activated, may be changed as appropriate to achieve the disclosed functionality as the transistors/circuits may be modified to complementary devices (e.g., interchanging PMOS and NMOS devices). Likewise, the functions, steps and/or actions of the methods in accordance with the embodiments of the invention described herein need not be performed in the particular order shown. Furthermore, although elements of the invention may be described or claimed in the singular, the plural is contemplated unless limitation to the singular is explicitly stated.

What is claimed is:

1. An apparatus comprising:
a magnetic tunnel junction (MTJ) element, comprising:
    a first ferromagnetic layer;
    a second ferromagnetic layer; and
    an insulating layer disposed between the first and second ferromagnetic layers;
an MTJ passivation layer forming protective sidewalls disposed adjacent to the first ferromagnetic layer, the second ferromagnetic layer, and the first insulating layer;
an insulation layer disposed adjacent to the MTJ passivation layer and surrounding the MTJ element;
an inter-level dielectric (ILD) that surrounds the MTJ element and the insulating layer; and
a global passivation layer disposed between the insulating layer and the ILD.

2. The apparatus of claim 1, wherein the MTJ passivation layer is formed of a dielectric material.

3. The apparatus of claim 2, wherein the MTJ passivation layer is formed of silicon carbide.

4. The apparatus of claim 1, wherein the MTJ passivation layer is formed of a given thickness in the range of about 5 nm to about 100 nm.

5. The apparatus of claim 1, further comprising:
an auxiliary shielding layer interposed between and separating the MTJ passivation layer and the insulation layer for magnetically shielding the MTJ element.

6. The apparatus of claim 5, wherein the auxiliary shielding layer is formed of a high permeability material.

7. The apparatus of claim 6, wherein the auxiliary shielding layer is formed of permalloy.

8. The apparatus of claim 1, wherein the insulation layer is formed of a carbide, a nitride, or an oxide compound.

9. The apparatus of claim 1, further comprising:
an auxiliary shielding layer interposed between and separating the MTJ passivation layer and the insulation layer for magnetically shielding the MTJ element; and
the global passivation layer disposed over the auxiliary shielding layer and the insulation layer.

10. The apparatus of claim 1, wherein the global passivation layer is disposed between metal layers of the apparatus and formed of a carbide, a nitride, or an oxide compound.

11. The apparatus of claim 1, wherein the apparatus is a spin-transfer torque magnetic random access memory (STT-MRAM).

12. The apparatus of claim 1, further comprising:
a top electrode patterned over a same width as the MTJ device and surrounded on its sides by the MTJ passivation layer and the second insulation layer, and
a metal layer formed on a top surface of the top electrode.

13. A method of forming a magnetic tunnel junction (MTJ) device including an MTJ element, comprising:
forming a first ferromagnetic layer;
forming a second ferromagnetic layer;
forming an insulating layer disposed between the first and second ferromagnetic layers;
forming an MTJ passivation layer of protective sidewalls disposed adjacent to the first ferromagnetic layer, the second ferromagnetic layer, and the insulating layer; and
forming an insulation layer disposed adjacent to the MTJ passivation layer and surrounding the MTJ element;
forming an inter-level dielectric (ILD) that surrounds the MTJ element and insulating layer; and
forming a global passivation layer disposed between the insulating layer and the ILD.

14. The method of claim 13, wherein the MTJ passivation layer is formed of a dielectric material.

15. The method of claim 13, further comprising:
forming an auxiliary shielding layer interposed between and separating the MTJ passivation layer and the insulation layer to magnetically shield the MTJ element.

16. The method of claim 15, wherein the auxiliary shielding layer is formed of a high permeability material.

17. The method of claim 13, further comprising:
forming an auxiliary shielding layer interposed between and separating the MTJ passivation layer and the insulation layer to magnetically shield the MTJ element; and
forming the global passivation layer over the auxiliary shielding layer and the insulation layer.

18. The method of claim 13, further comprising:
forming the global passivation layer of a carbide, a nitride, or an oxide compound between metal layers of the MTJ device.

19. An apparatus comprising:
a magnetic tunnel junction (MTJ) element, comprising:
a first ferromagnetic layer;
a second ferromagnetic layer; and
an insulating layer disposed between the first and second ferromagnetic layers;
MTJ passivation means disposed adjacent to the first ferromagnetic layer, the second ferromagnetic layer, and the insulating layer for at least partially isolating the MTJ element electrically and magnetically from interference;
insulation means disposed adjacent to the MTJ passivation layer and surrounding the MTJ element; and
an inter-level dielectric (ILD) means that surrounds the MTJ element and insulation means; and
global passivation means disposed between the insulating layer and the ILD.

20. The apparatus of claim 19, further comprising:
auxiliary shielding means interposed between and separating the MTJ passivation means and the insulation means for magnetically shielding the MTJ element.

21. The apparatus of claim 20, wherein the auxiliary shielding means has a high permeability.

22. The apparatus of claim 19, further comprising:
auxiliary shielding means interposed between and separating the MTJ passivation means and the insulation means for magnetically shielding the MTJ element; and
wherein the global passivation means is disposed over the auxiliary shielding means and the insulation means.

23. The apparatus of claim 19, wherein the global passivation means disposed between metal layers of the MTJ device.

* * * * *